United States Patent [19]

Beining et al.

[11] Patent Number: 4,692,809
[45] Date of Patent: Sep. 8, 1987

[54] INTEGRATED TOUCH PAINT SYSTEM FOR DISPLAYS

[75] Inventors: August H. Beining, Fullerton; William A. Smith, Laguna Hills, both of Calif.

[73] Assignee: Hughes Aircraft Company, Los Angeles, Calif.

[21] Appl. No.: 673,306

[22] Filed: Nov. 20, 1984

[51] Int. Cl.⁴ .............................................. H04M 5/65
[52] U.S. Cl. .................................... 358/247; 340/712
[58] Field of Search .................... 340/712, 706, 365 P, 340/721, 712, 365 YL; 178/18; 358/252, 253, 247; 250/221

[56] References Cited

U.S. PATENT DOCUMENTS

| | | | |
|---|---|---|---|
| 3,673,327 | 6/1972 | Johnson et al. | 178/18 |
| 3,764,813 | 10/1973 | Clement et al. | 250/221 R |
| 3,775,560 | 11/1973 | Ebeling et al. | 178/18 |
| 3,860,754 | 1/1975 | Johnson et al. | 178/18 |
| 4,198,623 | 4/1980 | Misek et al. | 340/365 P |
| 4,243,879 | 1/1981 | Carroll et al. | 250/221 |
| 4,246,613 | 1/1981 | Choder et al. | 358/253 |
| 4,247,737 | 1/1981 | Johnson et al. | 174/35 MS |
| 4,381,421 | 4/1983 | Coats et al. | 174/35 R |
| 4,412,255 | 10/1983 | Kuhlman et al. | 358/252 |
| 4,459,476 | 7/1984 | Weissmueller et al. | 250/221 |
| 4,553,142 | 11/1985 | Strauss | 340/712 |

FOREIGN PATENT DOCUMENTS

| | | |
|---|---|---|
| 0059063 | 9/1982 | European Pat. Off. . |
| 0112253 | 6/1984 | European Pat. Off. . |
| 0113218 | 7/1984 | European Pat. Off. . |
| 2042854 | 9/1980 | United Kingdom . |

Primary Examiner—Edward L. Coles, Sr.
Attorney, Agent, or Firm—T. A. Runk; A. W. Karambelas

[57] ABSTRACT

A touch panel system for displays is provided having electromagnetic energy interference shielding arrangements coupled with other features for an integrated, easily maintained, operator-adapted touch panel system. The system includes an electromagnetic energy interference shielding bezel mounted at the front of the display unit to an outer display housing. The bezel is integrated with an optically transparent and electrically conductive faceplate covering the display, and a raised border with an associated electromagnetic energy interference seal located at the periphery of the active touch panel area which is disposed between the faceplate and the bezel to complete an electrical path. The faceplate is roughened to disperse spatial interference patterns and reflections, and in one embodiment, has an electrically conductive wire mesh disposed within it for electromagnetic energy interference sealing and contrast enhancement for filtering extraneous light in the manner of a venetian blind. The faceplate may be provided with an electrically conductive coating for electromagnetic energy interference shielding and for contrast enhancement. The system includes a fixed function key area around the periphery of the display screen within the active touch panel area as defined by the raised border/zeal combination. The raised border/seal combination can be slanted to eliminate undesired reflection of the edge light beams.

50 Claims, 5 Drawing Figures

INTEGRATED TOUCH PAINT SYSTEM FOR DISPLAYS

BACKGROUND OF THE INVENTION

The invention relates generally to touch panel display systems and more particularly, to sealing light beam touch panel systems against electromagnetic energy interference.

Patents disclosing such touch panel display systems include U.S. Pat. No. 3,764,813 to Clement et al. granted Oct. 9, 1973; U.S. Pat. No. 3,775,560 to Ebeling et al. granted Nov. 27, 1973; and U.S. Pat. No. 4,198,623 to Misek et al. granted Apr. 15, 1980. In systems such as these where light beam sources direct beams of light across the face of a display toward light beam detectors located on the other side of the display, electromagnetic energy may escape from the display unit and allow its detection and it may also interfere with sensitive electronic equipment in the immediate area. Also, external electromagnetic energy may enter the display unit and interfere with its operation. Prior electromagnetic energy shielding arrangements for touch panel display units have been complex, bulky, and have not been sufficiently integrated with the display unit. These prior arrangements have in some cases made maintenance of the display unit more difficult and have typically not been of the type which also enhance display operations.

Various internal touch panel circuits as well as various display circuits generate signals which may radiate from the display unit. Where square wave signals are used inside the display unit, harmonics of relatively high frequency may escape. Where the touch panel display unit is to be used in an environment requiring the control of compromising emanations, suppressing the radiation of such signals may be required in order to avoid detection. In the case where the display unit is located near other equipment which radiates electromagnetic energy, such as a radar system, exposure of the display unit circuits to that energy may cause faults, processing errors or have other detrimental effects on display unit operation. As used herein, electromagnetic energy interference refers to signals which are of lower frequency than that of the touch panel light beams.

Accordingly, it is an object of the invention to provide an improved, integrated electromagnetic energy interference sealing arrangement for a light beam touch panel display system.

It is also an object of the invention to provide an integrated, electromagnetic energy interference shielding touch panel system that provides shielding in combination with certain other features to result in a simpler, lower cost, operator adapted touch panel system for displays.

It is also an object of the invention to provide an integrated touch panel system which enhances display viewing, enhances operator/touch panel interaction, and facilitates maintenance.

It is also an object of the invention to provide a touch panel system which, along with electromagnetic energy shielding arrangements, is integrated into a front panel bezel which permits easier disassembly and maintenance.

SUMMARY OF THE INVENTION

The foregoing objects and other objects are attained by the invention wherein there is provided a light beam touch panel system which includes an electrically conductive bezel disposed around the display periphery which would typically be mounted at the front of an electrically conductive display outer enclosure. The outer enclosure surrounds the display apparatus at its back, top, bottom, and sides and in accordance with the invention, it is mounted in electrical contact with the electrically conductive bezel which is mounted around the front of the display so that an electrically conductive path is provided for shielding the display unit against electromagnetic energy interference. Over the display screen is placed an optically transparent, electrically conductive faceplate through which the display is viewed. Around the faceplate and in contact with the bezel is a raised border which defines the active area of the touch panel. In addition, a seal is provided by means of the border or in association with the border which completes an electrical path between the faceplate and the electrically conductive bezel. The seal is transparent to the light beams of the touch panel which are directed through it. The bezel, faceplate and seal are used for sealing against the passage of electromagnetic energy interference out of the display unit and into the display unit as well as for other features discussed herein.

The faceplate provides electromagnetic energy interference shielding across the front of the display. Shielding by the faceplate is provided by means including an embedded electrically conductive mesh; an optically transparent, electrically conductive film placed coextensively with the faceplate; or forming the faceplate from electrically conductive material such as leaded glass. When numerous and thin, dark colored or black wires are used for the faceplate mesh, the mesh will be practically invisible to the operator but will intercept and shade the display from ambient illumination such as from ceiling lights in a manner similar to the function of a venetian blind. Also, where numerous and thin, dark colored or black wires are used, the faceplate acts as a neutral density filter achieving its shading and electromagnetic energy interference shielding function without distorting the colors of a color display. In accordance with another aspect of the invention, the surface of the faceplate is roughened for further display viewing enhancement. This roughening disperses reflections and masks oil and fingerprints thereby enhancing operator use. Also, the curvature of a cathode ray tube screen is compensated for by using a flat faceplate since it provides the operator with a uniform active area for using the touch panel.

As discussed above, the seal is used to complete the electrical path between the faceplate and the electrically conductive bezel. Means for implementing the seal include: (1) attaching the wire mesh of the faceplate across it or embedding the wire mesh in it to make direct contact with the bezel; (2) applying an optically transparent, electrically conductive film to it and in contact with the faceplate wire mesh or film and with the bezel to complete the electrical path; (3) attaching the electrically conductive film of the faceplate to it and in contact with the bezel; or (4) forming the seal from an electrically conductive material.

The raised border and associated seal are also disposed at an obtuse angle to the faceplate so that light striking the border/seal combination from light beam sources, particularly those located at the touch panel edges, will be reflected away from the associated light beam detector and will not circumvent an interrupting object. This configuration decreases the need for the use of a raised "reflection fence" on the seal which has been used in the past to achieve the same result.

In accordance with another aspect of the invention, the faceplate is made large enough to extend past the edges of the display screen. In this extra area around the display screen, fixed function legends may be located. The display operator may select these fixed functions by interrupting the light beams which are directed across the faceplate area covering these legends and the status of the fixed function may be indicated on the display screen.

Another feature of the invention involves mounting the light beam system electronics with the light beam sources and detectors all on the bezel which can be readily removed and replaced in the event of a malfunction or for maintenance.

From an overall standpoint then, the integrated touch panel system combines both electromagnetic energy interference sealing with viewing enhancement, the addition of fixed function key actuation and other features to produce an aesthetically pleasing, operator-adapted touch panel system.

Other objects, features, and advantages of the invention will become apparent from a consideration of the following detailed description and from the accompanying drawings.

DETAILED DESCRIPTION OF THE INVENTION

Figure 1:
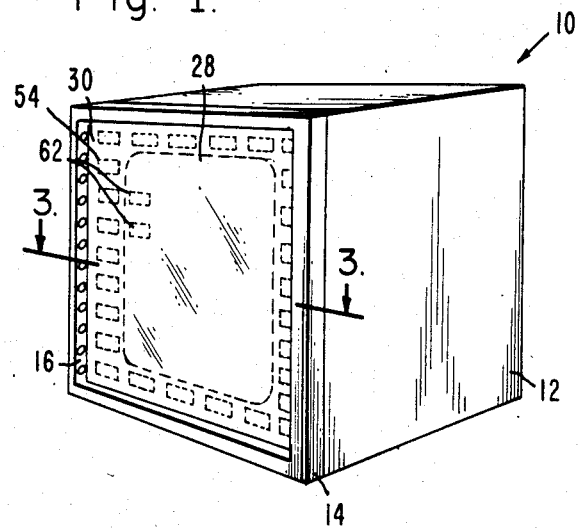
FIG. 1 is a diagrammatic view of a light beam touch panel display unit showing touch sensitive entry areas, regions where the light beams pass through the border, fixed function key areas, and the outer display unit enclosure.

Where appropriate, like reference numerals have been used in the various drawings to designate like elements. Referring more particularly to the drawings, FIG. 1 shows a light beam touch panel display unit 10 including an outer electrically conductive enclosure 12 for the back, top, bottom, and sides of the display unit 10, a front electrically conductive bezel 14 and a light beam touch panel system 16 at the front of the display unit 10.

Figure 2:
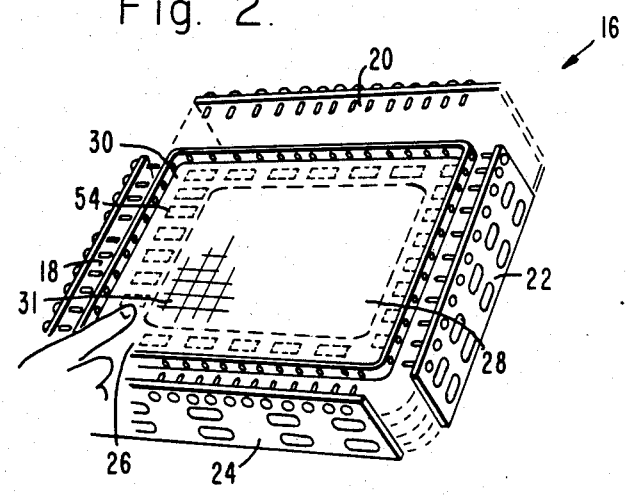
FIG. 2 is a perspective, diagrammatic view of the light beam touch panel system of FIG. 1 showing the peripheral circuit boards and touch sensitive area.

FIG. 2 shows the light beam touch panel system 16 where circuit boards 18, 20, 22 and 24 mounted peripherally around a faceplate 26. The display screen 28 and fixed function key areas 30 are shown by dashed lines. On the circuit boards 18, 20, 22 and 24 are mounted paired and opposing light beam sources and light beam detectors such as light emitting diodes (LEDs) and photo transistors. These light beam sources and detectors create a matrix of crossed light beams across the display faceplate 26 as is figuratively shown in FIG. 2 by the cross hatching 31. These circuit boards 18, 20, 22 and 24 also carry electronic circuitry associated with the light beam matrix.

As used herein, light beam matrix refers to an arrangement where the light beam transmitted between a light beam source which is paired with an opposing light beam detector is in approximately the same plane as the light beam transmitted between another paired light beam source and detector so that their respective beams may physically intersect; or where two or more sets of paired light beam sources and detectors are in different planes so that their respective beams may cross but not physically intersect.

Figure 3:
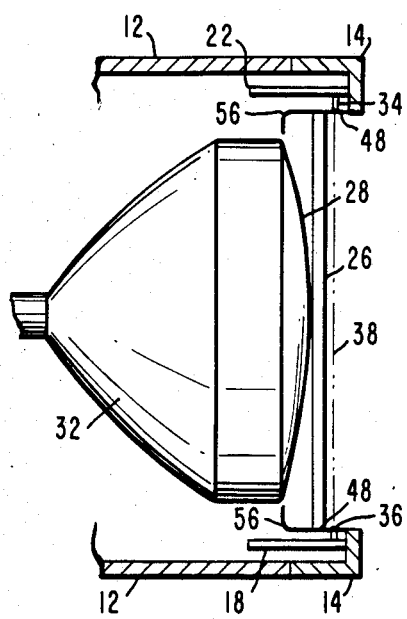
FIG. 3 is a schematic, partial cross-sectional top view of the front portion of a light beam touch panel display system taken along the plane 3—3 of FIG. 1.

FIG. 3 is a partial cross sectional top view of FIG. 1 and shows a display cathode ray tube (CRT) 32 mounted inside the outer enclosure 12 to which the front bezel 14 is attached. The faceplate 26 extends across the display screen 28 of the CRT 32 and circuit boards 18 and 22 are mounted peripherally around the faceplate 26. The light beam source 34 and light beam detector 36 are shown creating a light beam 38 positioned across and very close to the faceplate 26. Although a cathode ray tube 32 is shown as the means for creating the display in FIG. 3, it should be understood that other display means, such as a plasma display, may be used. Likewise, when discussing "light beams" herein, the term is not meant to be restricted to only visible light beams but is meant to include other portions of the spectrum as well, such as infrared.

Figure 4:
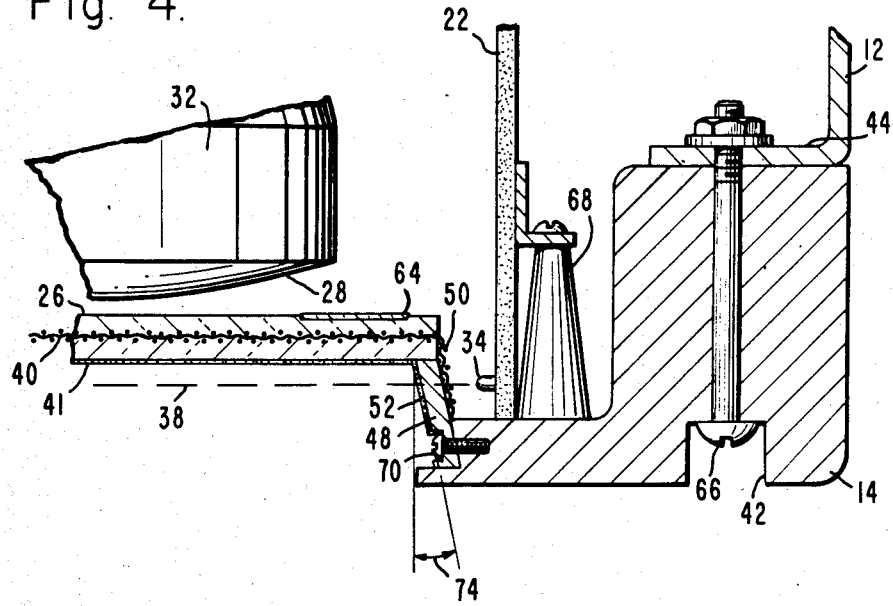
FIG. 4 is a partial cross-sectional fragmentary view of a corner of a light beam touch panel display system in accordance with the invention which shows shielding arrangements across the front of the display unit.
Figure 5:
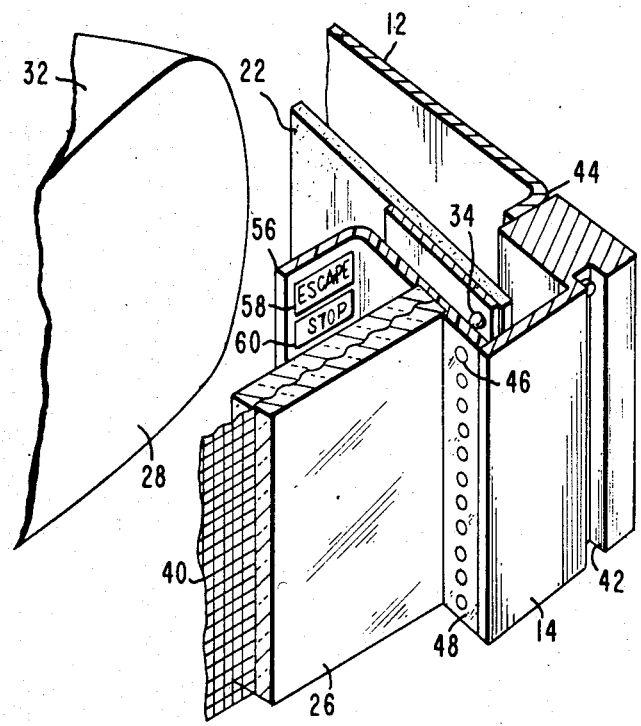
FIG. 5 is a partial cross-sectional view of a corner of a front portion of a light beam touch panel display unit illustrating part of the touch panel active area and electromagnetic energy interference shielding arrangements in accordance with the invention.

FIGS. 4 and 5 present display and faceplate shielding arrangements in accordance with the invention as well as other features. In FIG. 4, a wire mesh 40 is shown embedded in the faceplate 26. The faceplate 26 may be formed of optically transparent materials such as glass or plastic. In the case of a glass faceplate 26, the glass would normally be approximately $\frac{1}{8}$ inch thick. It may also be of a plastic material, such as polycarbonate, sold under the trademark "Lexan" by General Electric Co. of Pittsfield, Mass. and other trademarks, and if plastic is employed, the faceplate would typically be somewhat thicker, on the order of $\frac{1}{4}$ inch thick, for example.

The wire mesh 40 is formed of an electrically conductive material so that it will provide electromagnetic energy interference shielding, and in a preferred embodiment, it should be black to minimize interference with viewing the display screen 28. Although other materials may be used, a wire mesh with 145 by 145 strands per inch and formed of stainless steel wire with silver plating oxidized so that it turns black has been successfully employed. A blackened copper mesh may also be used.

The wires should be relatively fine, so as to avoid undue interference with viewing the display. Wires having a diameter of about 0.051 mm (two mils) have been successfully used. The use of 145 strands per inch mesh blocks about 50% of the viewing surface. It should be understood, that the wire spacing and wire diameter may be varied consistent with maintaining mesh openings sufficiently small to block electromagnetic energy frequencies of interest, and to maintain a desired ratio of viewing area to area which is blocked by the wires so that viewing of the display is enhanced and not significantly obstructed.

By using blackened wires embedded in a clear glass faceplate, the result is a neutral density filter which does not undesirably alter the colors of a color display but which enhances the contrast. An advantage of using the wire mesh 40 embedded in the faceplate 26 is that it shades the display screen 28 which is located behind it, from angular ambient illumination such as from overhead room lighting. This shading is in the manner of the shading provided by a venetian blind.

The faceplate 26 may be provided with a very thin electrically conductive film or coating 41 across it as represented by the thickened line (not to scale) in FIG. 4, to provide a supplemental electromagnetic energy interference seal to the embedded wire mesh 40 or it may be used without the embedded wire mesh 40. Usable electrically conductive films or coatings 41 include a gold flash, very thin, so that it is nearly transparent, or indium tin oxide which has a high degree of optical transparency.

For further display enhancement, the surface of the faceplate 26 may be slightly roughened, such as by a light chemical etch or by particle blasting. For many applications, achieving approximately an eighty grit surface is desirable. This roughening will mask fingerprints and other dirt on the faceplate 26. This roughening also serves to disperse reflections from this surface and will disperse spatial frequency interference patterns such as those generated between the wire mesh 40 in the faceplate 26 and a color display tube shadow mask grid where a color cathode ray tube 32 is used.

Referring to both FIGS. 4 and 5, FIG. 4 presents a partial cross sectional view of an electromagnetic energy interference shielding arrangement in accordance with the invention. A partial cross sectional, perspective view of a shielding arrangement also in accordance with the invention is shown in FIG. 5. Shown in both FIGS. 4 and 5 are the outer enclosure 12, the front bezel 14 and the faceplate 26. As shown, the front bezel 14 includes a recess 42 for concealing fasteners which secure the bezel 14 to the inturned flange 44 of the outer enclosure 12. One of the light beam sources 34 is shown and a region 46 where the beam of light passes through a raised border 48 is shown in FIG. 5.

The border 48 in association with an electromagnetic energy interference sealing means also acts as an additional shielding and support member and extends between the faceplate 26 and the bezel 14. The seal associated with the border 48 serves to close a possible electromagnetic energy interference path into and out of the display unit 10. The border 48 may be made of optically transparent material such as plastic or glass. As shown in FIG. 4 the seal 50 associated with the border 48 is the wire mesh 40 which has been extended parallel to and immediately behind the border 48 to make electrical contact with the bezel 14. However, the wire mesh 40 may be embedded in the border 48 to act as the seal 50. In addition, the border 48 may be provided with an electrically conductive transparent coating 52 of the type mentioned above for the faceplate 26 for making it electrically conductive. The coating should be of a nature, however, that permits the light beams to pass through it without substantial attenuation. Where the conductive mesh screen 40 is used as the seal 50, it should be coarse enough to adequately permit the passage of the light beams through it consistent with maintaining mesh openings sufficiently small enough to block electromagnetic energy frequencies of interest. Additionally, the border 48 may be formed of an electrically conductive material so that it simultaneously functions as the border 48 and as the seal 50.

As shown in FIGS. 1 and 2, the faceplate 26 has extra areas 30 extending beyond the display screen 28 in which legends 54 may be viewed. These legends 54 are shown as dashed boxes. One method of displaying these legends 54 is to mount them on a frame 56 such as that shown in FIGS. 3 and 5 where a frame 56 is positioned behind the faceplate 26 and to one side of the display screen 28 and can be seen through the faceplate 26. This frame 56 permits the presentation of legends on its surface such as those shown in FIG. 5, i.e., "ESCAPE" 58 and "STOP" 60. These legends may represent system control functions which may be selected by an operator of the unit by touching an object to the corresponding faceplate location, thereby interrupting the crossing light beams extending over that particular area of the faceplate 26.

These functions may be termed "fixed function key areas" or FFKs and are available to the operator instead of using a subsidiary switching panel or keyboard. The FFK legend "ESCAPE" 58 is shown in FIG. 5 on the frame 56 and this fixed function key could control the system to depart from its normal sequence of operation. Other fixed function keys may be employed to change the type of display, to change the scale of the display, or to shift the position of the display, by way of specific examples. Using FFKs in this way facilitates operation of the display unit 10 since the operator need only be concerned with the information displayed through the faceplate 26 and does not need to refer elsewhere to interact with the unit, such as by using a keyboard, thus tending to increase display unit operation efficiency. Through use, the operator becomes accustomed to the position of the FFK and its use becomes automatic.

As shown in FIGS. 3 and 5, the frame 56 can be a part of the raised border 48 which extends behind the faceplate 26. The legends 54 may be placed on the frame 56 by such means as electroluminescent backlighted film strips. The operational state of the particular legend or FFK may be indicated as shown in FIG. 1 by means of symbols 62 displayed adjacent the legend 54 on the display screen 28. Other arrangements for mounting the frame 56 will become apparent to those skilled in the art, the arrangement of FIG. 5 has been found to give satisfactory results.

Another method of displaying the legends is shown in FIG. 4 where a legend 64 is made a part of the faceplate 26 as shown by the thickened line. Techniques for accomplishing this include etching the legend into the faceplate 26 as shown by the etched legend 64 or applying a label to the faceplate 26. Additionally, the legends may extend over part of the display screen 28 for backlighting and/or status indication of the FFK.

FIG. 4 presents a more detailed view of an arrangement of various touch panel components in accordance with the invention. An integrated arrangement is shown where the touch panel circuit board 22, raised border 48, seal 50 and faceplate 26 are attached to the front bezel 14. Fasteners 66 may be provided to secure the inturned flange 44 of the outer enclosure 12 to the bezel 14. The circuit board 22 may be supported from the bezel 14 by a standoff insulator and bracket assembly 68. The electrically conductive, embedded wire mesh 40 may extend around the edge of the faceplate 26 and be clamped to the bezel 14 by fasteners 70 which extend through the raised border 48. This extended wire mesh 40 forms the seal 50 associated with the border 48. The border 48 may also be provided with an optically transparent, conductive coating 52 of one of the types mentioned hereinabove for use as the seal 50. The light beam source 34 is shown projecting a beam 38 which is detected by a light beam detector (not shown) positioned on the other edge of the faceplate 26.

A further feature of the invention relates to the configuration of the raised border 48 and seal 50 surrounding the touch panel active area. As shown in FIG. 4, the border 48 and seal 50 are not perpendicular to the faceplate 26 but are angled at an obtuse angle 74 of approximately 10°-15°. In prior techniques where the border was disposed perpendicular to the display screen or faceplate, the light beam closest to the border would be reflected by the border. In some cases the reflection of the light beam from the border would circumvent the interrupting object and be received by the detector and it would be difficult to interrupt that particular light beam. The light, in effect, went around the object. A prior technique for solving this problem involved placing a "reflection fence" at the touch panel edge to obstruct the light beam. In the present invention, it has been found that by angling the border 48 and seal 50 combination by approximately 10°-15° from the perpendicular to the faceplate surface, i.e., an obtuse angle from the faceplate, the light reflecting from the strip from the light beams will be reflected into space and will not reach the light beam detector by circumventing the finger or other interrupting object. Thus, by incorporating this technique in accordance which the invention around the touch panel perimeter, a well defined, active touch panel area still exists; all the light beams are operational and no "reflection fence" structure is required.

As with the other structural elements discussed above, this angled border 48 and seal 50 are attached to the front bezel 14. Since the faceplate 26, the touch panel circuit boards 18, 20, 22 and 24, including the light beam sources and the light beam detectors are all mounted on the bezel 14, a subassembly is formed which may be removed as a unit. This facilitates trouble shooting and repair, and permits replacement of the bezel and associated electronics with a spare unit while the old unit is being repaired or maintained. In addition, the display unit 10 is completely shielded from electromagnetic energy interference and all shielding means are electrically connected to the bezel 14. Electrically connecting the outer enclosure 12 to ground potential will provide a desirable path for electromagnetic energy interference. The above results in a fully integrated touch panel display system and with enhanced display viewing features. All operator controls are accessible from the front panel and no add-on electromagnetic energy shielding apparatus is required. This results in a simpler, easier to use and maintain system allowing the use of touch panels on shielded displays.

In the foregoing detailed description and in the accompanying drawings, certain preferred embodiments of the invention have been described. However, variations of the specific constructions shown may be employed without departing from the scope of the present invention. Thus, by way of example and not of limitation, various combinations of techniques are possible. For example, the faceplate 26 may have an embedded wire mesh, the seal 50 may comprise an electrically conductive coating and the bezel 14 may be formed of electrically conductive material. As another example, the faceplate 26, seal 50, and bezel 14 may all use the same electromagnetic energy interference shielding means, such as electrically conductive coating. Instead of using a separate border between the faceplate and the bezel, the faceplate could be formed of a single sheet of plastic bent or dished at the edges to directly engage the bezel, with the light beams passing through the outer stepped or beveled edge of the plastic sheet, and with the conductive coating or the conductive mesh, or both, extending from engagement with the bezel entirely across the dished or stepped faceplate. Alternatively, a single bezel member may extend all of the way from the faceplate to engage the outer housing or a single member may be formed which includes the faceplate, bezel, border, and seal. Accordingly, it is intended that the present invention include such modifications and variations and others unless the claims limit the invention otherwise.

What is claimed is:

1. An integrated, electromagnetic energy interference shielding, light beam touch panel system for use in conjunction with a display apparatus having a screen upon which information is displayed, comprising:
   a substantially optically transparent faceplate disposed across the screen through which the screen may be viewed;
   first means for shielding the faceplate against the propagation through it of electromagnetic energy interference;
   a raised border through which the light beams pass disposed at a preselected position in relation to the faceplate to define an active touch panel area over the faceplate;
   second means for shielding the raised border against the propagation through it of electromagnetic energy interference, the second means being in electrical contact with the first means;
   a bezel mounted at the front of the display apparatus and adjacent the active touch panel area;
   third means for shielding the bezel against the propagation through it of electromagnetic energy interference, the third means being in electrical contact with the second means;
   an outer enclosure mounted around the sides, top, bottom, and back of the display apparatus and to the bezel; and
   fourth means for shielding the outer enclosure against the propagation through it of electromagnetic energy interference, the fourth means being in electrical contact with the third means.

2. The integrated touch panel system of claim 1 wherein the first means comprises an electrically conductive wire mesh disposed across in the faceplate and coextensive therewith through which the screen can be viewed.

3. The integrated touch panel system of claim 2 wherein the electrically conductive wire mesh is embedded in the faceplate.

4. The integrated touch panel system of claim 1 wherein the first means comprises a substantially optically transparent, electrically conductive film disposed on the faceplate and coextensive therewith.

5. The integrated touch panel system of claim 4 wherein the film comprises gold.

6. The integrated touch panel system of claim 4 wherein the film comprises indium tin oxide.

7. The integrated touch panel system of claim 1 wherein the first means comprises forming the faceplate of electrically conductive material.

8. The integrated touch panel system of claim 1 wherein the faceplate has a roughened surface.

9. The integrated touch panel system of claim 1 wherein the raised border is disposed in relation to the active touch panel area over the faceplate at an obtuse angle.

10. The integrated touch panel system of claim 1 wherein the second means comprises an electrically conductive wire mesh mounted between and in contact with the first means and the third means.

11. The integrated touch panel system of claim 10 wherein the electrically conductive wire mesh is embedded in the raised border and is coextensive therewith.

12. The integrated touch panel system of claim 1 wherein the second means comprises a substantially optically transparent, electrically conductive film disposed on the raised border and in electrical contact with the first means and the third means.

13. The integrated touch panel system of claim 12 wherein the film comprises gold.

14. The integrated touch panel system of claim 10 wherein the film comprises indium tin oxide.

15. The integrated touch panel system of claim 1 wherein the second means comprises forming the raised border of electrically conductive material.

16. The integrated touch panel system of claim 1 further comprising:
   sixth means for rigidly mounting light beam sources and light beam detectors and associated electronics in relation to the bezel and adjacent the raised border;
   seventh means for rigidly mounting the raised border in relation to the bezel; and
   eighth means for rigidly mounting the faceplate in relation to the bezel;
   whereby the sixth means, raised border, and faceplate may be removed with the bezel as a unit from the front of the outer enclosure.

17. The integrated touch panel system of claim 1 wherein the faceplate extends beyond the screen and wherein ninth means are provided for displaying a fixed function key legend in the area thereof beyond the screen.

18. The integrated touch panel system of claim 17 wherein the ninth means comprises mounting a rigid frame behind the faceplate on which the fixed function key legend is displayed so that it may be viewed through the area of the faceplate extending beyond the screen.

19. The integrated touch panel system of claim 17 wherein the ninth means comprises etching the fixed function key legend into the faceplate.

20. The integrated touch panel system of claim 17 wherein a status indication of the fixed function key legend is displayed on the screen adjacent that legend.

21. The integrated touch panel system of claim 16 wherein the faceplate, raised border, and bezel are formed as a single piece.

22. The integrated touch panel system of claim 21 wherein the first means, second means, and third means comprise an electrically conductive wire mesh associated with the single piece and coextensive therewith, through which the screen can be viewed, and in electrical contact with the fourth means.

23. The integrated touch panel system of claim 22 wherein the wire mesh is embedded in the single piece and is coextensive therewith.

24. The integrated touch panel system of claim 21 wherein the first means, second means, and third means comprise a substantially optically transparent, electrically conductive film disposed on the single piece and coextensive therewith and in electrical contact with the fourth means.

25. The integrated touch panel system of claim 24 wherein the single piece is formed of an electrically conductive material.

26. An integrated, electromagnetic energy interference shielding, light beam touch panel system for use in conjunction with a display apparatus having a screen upon which information is displayed, comprising:
   a substantially optically transparent faceplate disposed across the screen through which the screen may be viewed;
   first means for shielding the faceplate against the propagation through it of electromagnetic energy interference comprising electrically conductive material coextensive with the faceplate through which the screen can be viewed;
   a raised border through which the light beams pass disposed at a preselected position in relation to the faceplate to define an active touch panel area over the faceplate;
   second means for shielding the raised border against the propagation through it of electromagnetic energy interference, comprising electrically conductive material coextensive with the border through which the light beams pass and which is in electrical contact with the first means;
   an electrically conductive bezel mounted at the front of the display apparatus and in electrical contact with the second means; and
   an electrically conductive outer enclosure substantially surrounding the sides, top, bottom, and back of the display apparatus and in electrical contact with the bezel.

27. The integrated touch panel system of claim 26 wherein the first means comprises an electrically conductive wire mesh disposed across the faceplate and coextensive therewith through which the screen can be viewed.

28. The integrated touch panel system of claim 27 wherein the electrically conductive wire mesh is embedded in the faceplate.

29. The integrated touch panel system of claim 26 wherein the first means comprises a substantially optically transparent, electrically conductive film disposed on the faceplate and coextensive therewith.

30. The integrated touch panel system of claim 29 wherein the film comprises gold.

31. The integrated touch panel system of claim 29 wherein the film comprises indium tin oxide.

32. The integrated touch panel system of claim 26 wherein the first means comprises forming the faceplate of electrically conductive material.

33. The integrated touch panel system of claim 26 wherein the faceplate has a roughened surface.

34. The integrated touch panel system of claim 26 wherein the raised border is disposed in relation to the active touch panel area over the faceplate at an obtuse angle.

35. The integrated touch panel system of claim 26 wherein the second means comprises an electrically conductive wire mesh mounted between and in electrical contact with the first means and the bezel.

36. The integrated touch panel system of claim 35 wherein the electrically conductive wire mesh is embedded in the raised border and is coextensive therewith.

37. The integrated touch panel system of claim 26 wherein the second means comprises a substantially optically transparent, electrically conductive film disposed on the raised border and in electrical contact with the first means and the third means.

38. The integrated touch panel system of claim 37 wherein the film comprises gold.

39. The integrated touch panel system of claim 37 wherein the film comprises indium tin oxide.

40. The integrated touch panel system of claim 26 wherein the second means comprises forming the raised border of electrically conductive material.

41. The integrated touch panel system of claim 26 further comprising:
fifth means for rigidly mounting light beam sources and light beam detectors and associated electronics in relation to the bezel and adjacent the raised border;
sixth means for rigidly mounting the raised border in relation to the bezel; and
seventh means for rigidly mounting the faceplate in relation to the bezel;
whereby the fifth means, raised border, and faceplate may be removed with the bezel as a unit from the front of the outer enclosure.

42. The integrated touch panel system of claim 26 wherein the faceplate extends beyond the screen and wherein eighth means are provided for displaying a fixed function key legend in the area thereof beyond the screen.

43. The integrated touch panel system of claim 42 wherein the eighth means comprises mounting a rigid frame behind the faceplate on which the fixed function key legend is displayed so that it may be viewed through the area of the faceplate extending beyond the screen.

44. The integrated touch panel system of claim 42 wherein the eighth means comprises etching the fixed function key legend into the faceplate.

45. The integrated touch panel system of claim 42 wherein a status indication of the fixed function key legend is displayed on the screen adjacent that legend.

46. An integrated, electromagnetic energy interference shielding, light beam touch panel system for use in conjunction with a display apparatus having a screen upon which information is displayed, comprising:
a substantially optically transparent faceplate disposed across the screen through which the screen may be viewed;
first means for shielding the faceplate against the propagation through it of electromagnetic energy interference comprising an electrically conductive wire mesh embedded in the faceplate and coextensive therewith;
a raised border through which the light beams pass disposed at a preselected position in relation to the faceplate and at an obtuse angle to the faceplate to define an active touch panel area over the faceplate;
second means for shielding the raised border against the propagation through it of electromagnetic energy interference, the second means comprising positioning the wire mesh so that it is also coextensive with the raised border;
an electrically conductive bezel mounted at the front of the display apparatus and in contact with the raised border and the wire mesh; and
an electrically conductive outer enclosure substantially surrounding the sides, top, bottom, and back of the display apparatus and in electrical contact with the bezel;
whereby electrically conductive shielding substantially surrounds the display apparatus.

47. The integrated touch panel system of claim 46 wherein the faceplate extends beyond the screen and wherein third means are provided for displaying a fixed function key legend in the area thereof beyond the screen.

48. The integrated touch panel system of claim 47 wherein the third means comprises mounting a rigid frame behind the faceplate on which the fixed function key legend is displayed so that it may be viewed through the area of the faceplate extending beyond the screen.

49. The integrated touch panel system of claim 47 wherein the third means comprises etching the fixed function key legend into the faceplate.

50. The integrated touch panel system of claim 47 wherein a status indication of the fixed function key legend is displayed on the screen adjacent that legend.

* * * * *